United States Patent
Watanabe et al.

(10) Patent No.: US 11,921,386 B2
(45) Date of Patent: Mar. 5, 2024

(54) DISPLAY DEVICE

(71) Applicant: Japan Display Inc., Tokyo (JP)

(72) Inventors: Yoshihiro Watanabe, Tokyo (JP); Yoshikatsu Imazeki, Tokyo (JP); Yoichi Kamijo, Tokyo (JP); Koichi Miyasaka, Tokyo (JP); Shuichi Osawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 490 days.

(21) Appl. No.: 17/193,729

(22) Filed: Mar. 5, 2021

(65) Prior Publication Data

US 2021/0191210 A1 Jun. 24, 2021

Related U.S. Application Data

(63) Continuation of application No. PCT/JP2019/025257, filed on Jun. 25, 2019.

(30) Foreign Application Priority Data

Sep. 5, 2018 (JP) .................................. 2018-166061

(51) Int. Cl.
*G02F 1/1362* (2006.01)
*G02F 1/1335* (2006.01)
*G02F 1/13357* (2006.01)

(52) U.S. Cl.
CPC .. *G02F 1/136286* (2013.01); *G02F 1/133524* (2013.01); *G02F 1/133608* (2013.01)

(58) Field of Classification Search
CPC .............. G02F 1/136286; G02F 1/133524
USPC ...................... 349/58–60, 149–152
See application file for complete search history.

(56) References Cited

U.S. PATENT DOCUMENTS

| 2005/0018102 | A1* | 1/2005 | Hirano ................ G02F 1/13452 349/58 |
| 2009/0128733 | A1* | 5/2009 | Teramoto .......... G02F 1/133308 349/60 |
| 2017/0351019 | A1 | 12/2017 | Kadowaki et al. |
| 2018/0062095 | A1 | 3/2018 | Andou et al. |

FOREIGN PATENT DOCUMENTS

| JP | 2007-121898 | 5/2007 |
| JP | 2010-101941 A | 5/2010 |
| JP | 2018-036299 A | 3/2018 |
| WO | 2016/104348 A1 | 6/2016 |

OTHER PUBLICATIONS

Indian Office Action dated Feb. 4, 2022 in corresponding Indian Application No. 202117015689.
Japanese Office Action dated May 24, 2022 in corresponding Indian Application No. 2018-166061.

* cited by examiner

*Primary Examiner* — Charles S Chang
(74) *Attorney, Agent, or Firm* — K&L Gates LLP

(57) ABSTRACT

According to one embodiment, a display device includes a display panel, a first wiring board mounted on the display panel, and a backlight unit located on a back surface side of the display panel to illuminate the display panel. The backlight unit includes a casing which includes a bottom plate including a first slit and a side plate standing at the bottom plate, and a light guide arranged in the casing. The first wiring board passes between the side plate and the light guide and through the first slit and is bent toward a back surface side of the casing.

6 Claims, 9 Drawing Sheets

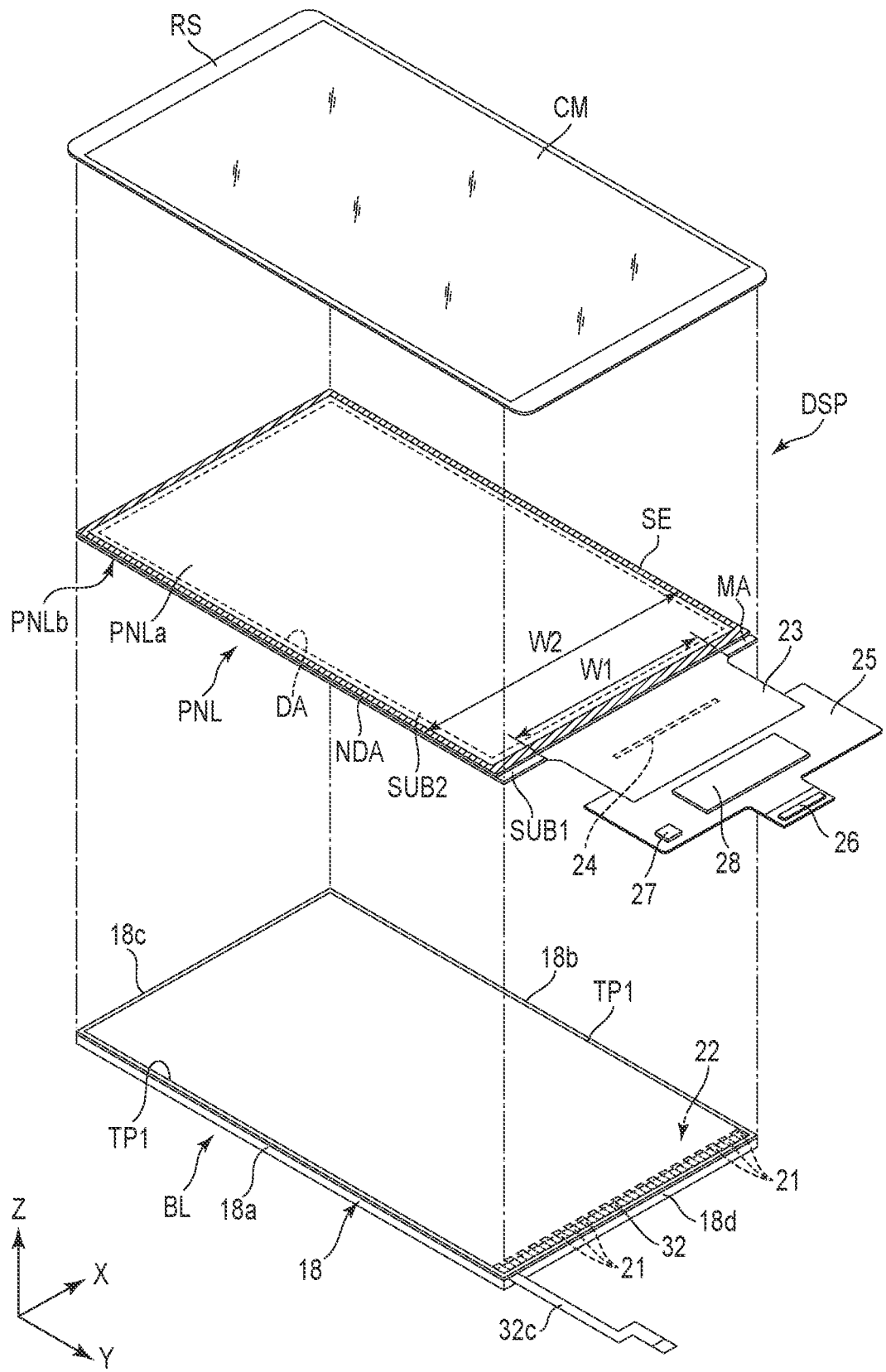
F I G. 1

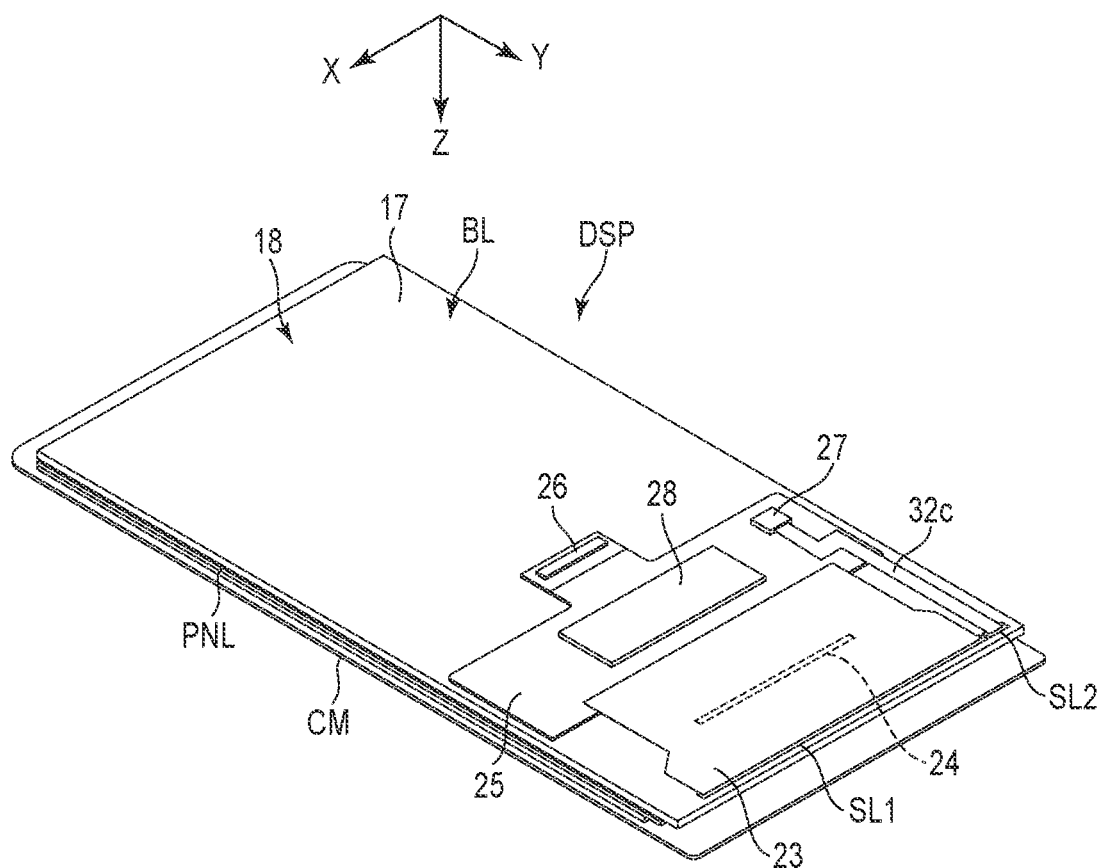
F I G. 2

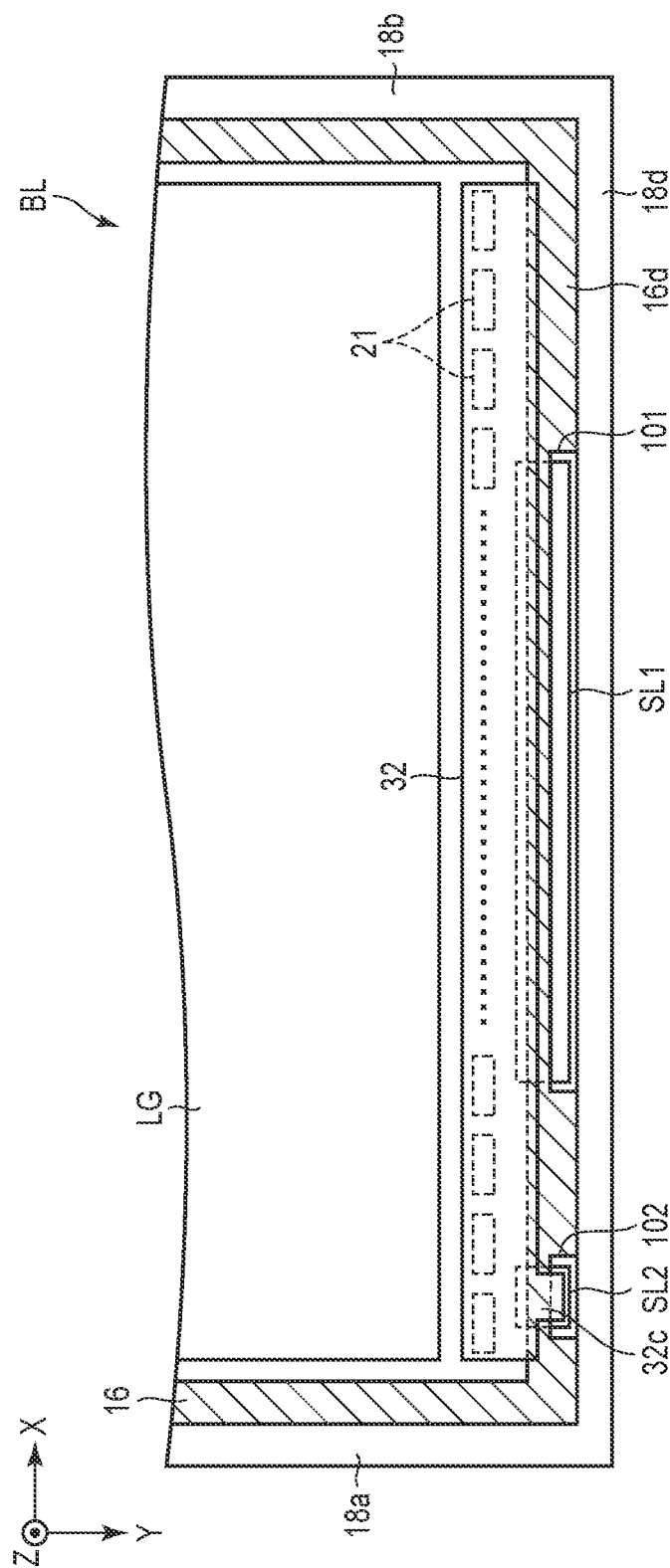
F I G. 4

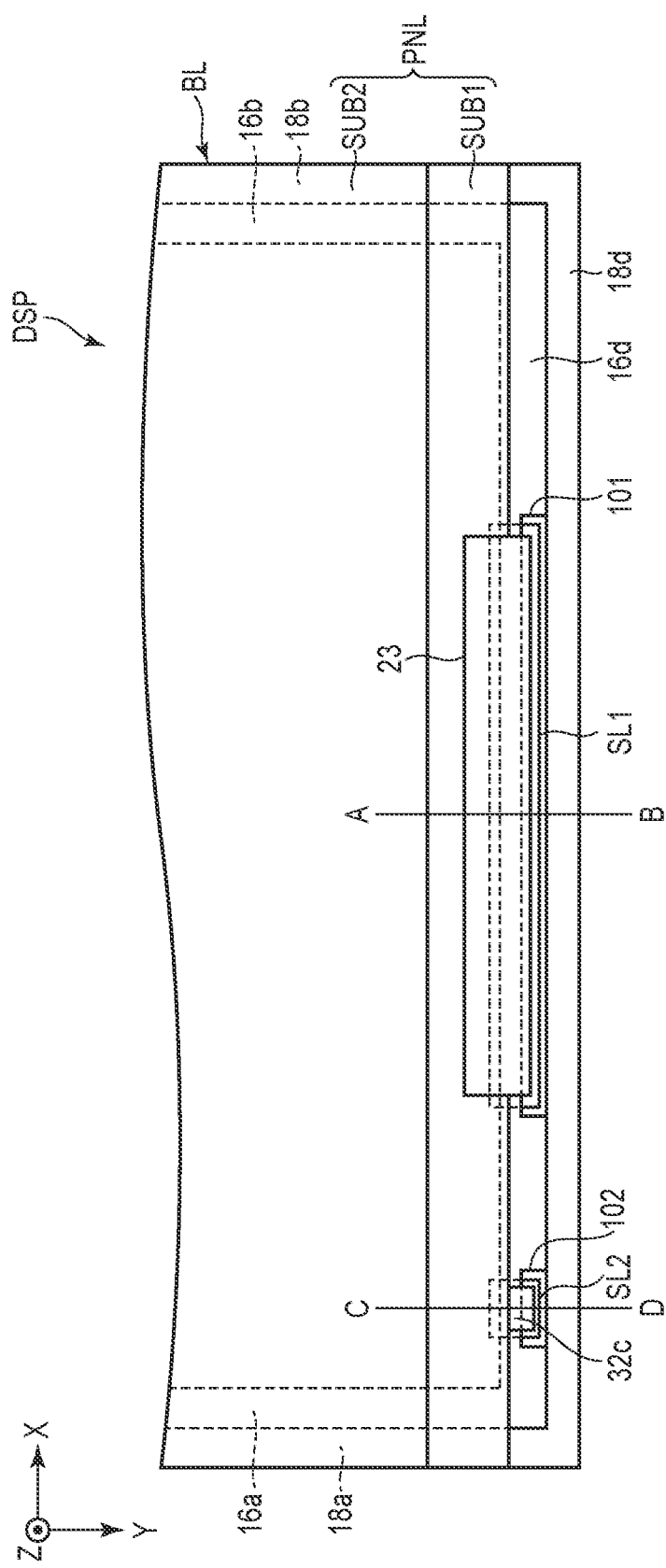
F I G. 5

DISPLAY DEVICE

CROSS-REFERENCE TO RELATED APPLICATIONS

This application is a Continuation Application of PCT Application No. PCT/JP2019/025257, filed Jun. 25, 2019 and based upon and claiming the benefit of priority from Japanese Patent Application No. 2018-166061, filed Sep. 5, 2018, the entire contents of all of which are incorporated herein by reference.

FIELD

Embodiments described herein relate generally to a display device.

BACKGROUND

Liquid crystal display devices, organic EL display devices, and the like are widely used as display devices for smartphones, tablet computers, car navigation systems, and the like. In recent years, there has been a demand for narrower frames in order to reduce the size of these display devices or to enlarge the display area for displaying images. For example, the liquid crystal display device comprises a liquid crystal display panel and a backlight device which illuminates the liquid crystal display panel. The backlight device includes a casing (or bezel) attached to the liquid crystal display panel, and various optical members arranged in the casing. One end of a flexible printed circuit (FPC) is joined to the liquid crystal display panel. The FPC extends outward from the liquid crystal display panel, and is bent, for example, toward the bottom of the casing.

SUMMARY

The present disclosure generally relates to a display device.

According to one embodiment, a display device includes a display panel, a first wiring board mounted on the display panel, and a backlight unit located on a back surface side of the display panel to illuminate the display panel. The backlight unit includes a casing which includes a bottom plate including a first slit and a side plate standing at the bottom plate, and a light guide arranged in the casing. The first wiring board passes between the side plate and the light guide and through the first slit and is bent toward a back surface side of the casing.

BRIEF DESCRIPTION OF THE DRAWINGS

FIG. 1 is an exploded perspective view showing a display device of the embodiments.

FIG. 2 is a perspective view showing a back surface side of the display device.

FIG. 4 is a plan view showing a part of the backlight unit shown in FIG. 3.

FIG. 5 is a plan view showing a display panel arranged on the backlight unit shown in FIG. 4.

DETAILED DESCRIPTION

Figure 3:
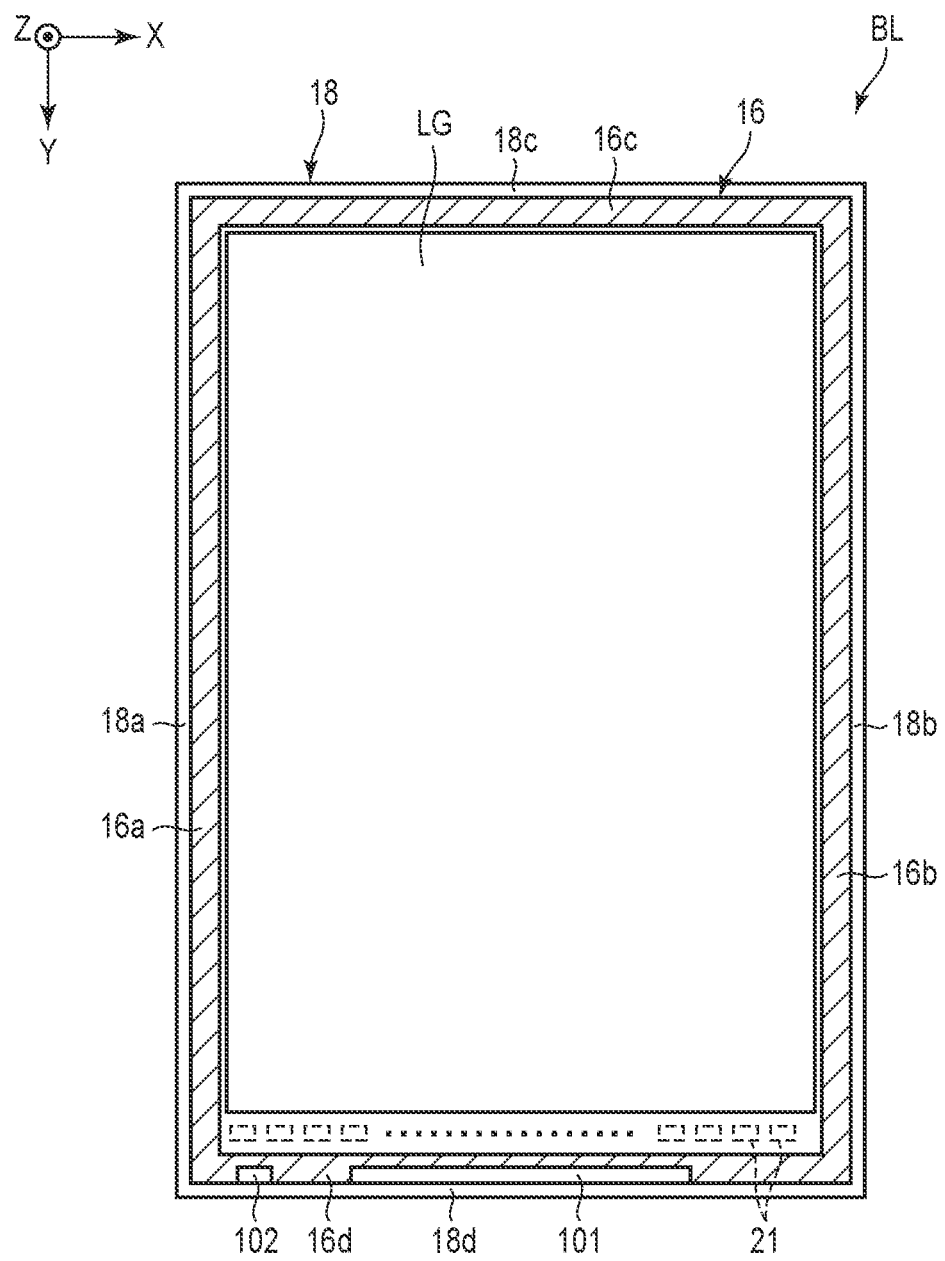
FIG. 3 is a plan view showing a backlight unit of the embodiments.

In general, according to one embodiment, there is provided a display device including a display panel, a first wiring board mounted on the display panel, and a backlight unit located on a back surface side of the display panel to illuminate the display panel. The backlight unit includes a casing which includes a bottom plate including a first slit and a side plate standing at the bottom plate, and a light guide arranged in the casing. The first wiring board passes between the side plate and the light guide and through the first slit and is bent toward a back surface side of the casing.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

FIG. 1 is an exploded perspective view showing a display device DSP of the embodiments.

The display device DSP can be used by being incorporated in various electronic devices such as smartphones, tablet terminals, mobile phones, notebook PCs, portable game machines, electronic dictionaries, television devices, and car navigation systems.

The display device DSP comprises an active-matrix display panel PNL, a cover member CM arranged so as to be overlaid on the display surface PNLa which is one surface of the display panel PNL and to cover the entire display surface PNLa, a backlight unit BL arranged to be opposed to a back surface PNLb which is the other surface of the display panel PNL and to illuminate the display panel PNL, a first wiring board 23, and a sub-wiring board 25.

The display panel PNL comprises a first substrate SUB1 having a rectangular plate shape, and a second substrate SUB2 having a rectangular plate shape and arranged to be opposed to the first substrate SUB1. A peripheral portion of the second substrate SUB2 is stuck on the first substrate SUB1 with a sealing member SE. In FIG. 1, the sealing member SE is located in a region represented by hatching. Each of the first substrate SUB1 and the second substrate SUB2 is formed of a transparent insulating substrate such as a glass plate or a resin plate.

The display panel PNL includes a rectangular display region DA in a region which becomes an inner side of the sealing member SE in a state of plainly viewing the display surface PNLa (i.e., hereinafter referred to as a state in which the display panel is visually recognized from the normal direction of the surface of the display panel). An image is displayed in the display region DA. A non-display region NDA having a rectangular frame shape is provided around the display region DA. The display panel PNL has a transmissive display function of displaying an image by selectively transmitting light from the backlight unit BL to the display region DA.

The display device DSP includes the first wiring board 23 mounted on the display panel PNL. The first wiring board 23 has flexibility. A mounting portion MA which is not overlaid on the second substrate SUB2 is provided on one shorter side of the first substrate SUB1, and one end of the first wiring substrate 23 is joined to the mounting portion MA. A width W1 of one end of the first wiring substrate 23 is smaller than a width W2 of the first substrate SUB1.

A semiconductor element such as a driver IC chip 24 which functions as a signal supply source for driving the display panel PNL is mounted on the first wiring board 23. The sub-wiring board 25 is joined to the extending end of the first wiring board 23. A capacitor 28, connectors 26 and 27 and the like are mounted on the sub-wiring board 25.

The cover member CM is formed of, for example, a glass plate or an acrylic transparent resin and has a rectangular plate shape. A frame-shaped light-shielding layer RS is formed on a peripheral portion of the back surface of the cover member CM (i.e., a surface on the display panel PNL side or a surface opposite to the surface facing an observer).

The backlight unit BL comprises a casing 18, a plurality of optical members (not shown) arranged in the casing 18, a light source unit 22 which supplies light made incident on the optical members, and a frame-shaped double-sided tape TP1.

The casing 18 includes a rectangular bottom plate 17 to be described later with reference to FIG. 2, and a plurality of side plates 18a, 18b, 18c, and 18d rising from side edges of the bottom plate 17. The light source unit 22 comprises a plurality of light sources 21 arranged at predetermined intervals along the side plate 18d, and a second wiring board 32 extending along the side plate 18d and supporting the light source 21. The second wiring board 32 is formed to have a length substantially equal to the side plate 18d. In addition, the second wiring board 32 integrally includes a connection end portion 32c.

FIG. 2 is a perspective view showing the back surface side of the display device DSP.

In the embodiments, the casing 18 includes a first slit SL1 and a second slit SL2 formed in the bottom plate 17. The first wiring board 23 passes through the first slit SL 1 and is arranged to be overlaid on the bottom plate 17. In addition, the connection end portion 32c passes through the second slit SL2 and is arranged to be overlaid on the bottom plate 17. The connection end portion 32c is connected to a connector 27. Incidentally, in the example illustrated, the first wiring board 23 and the connection end portion 32c pass through different slits, respectively. However, the first slit SL1 and the second slit SL2 may be one connected slit.

FIG. 3 is a plan view showing the backlight unit BL of the embodiments.

The backlight unit BL further comprises a frame (reinforcement member) 16 having a rectangular frame shape, which is arranged inside the side plates 18a to 18d, and a light guide LG arranged inside the frame 16. The frame 16 includes a first portion 16a, a second portion 16b, a third portion 16c, and a fourth portion 16d that are in contact with the side plates 18a to 18d, respectively, and functions as a reinforcing member for the casing 18. The frame 16 includes a recess portion 101 and a recess portion 102 in the fourth portion 16d. The recess portion 101 and the recess portion 102 are formed on the side of the fourth portion 16d on a side opposed to the side plate 18d, and form a gap between the fourth portion 16d and the side plate 18d.

Both the frame 16 and the casing 18 can be integrally formed of resin or metal. Alternatively, either of them can be formed of resin and the other can be formed of metal. In the embodiments, the bottom plate 17 and the side plates 18a to 18d are formed of metal such as stainless steel (SUS), and the frame 16 is formed of resin. The frame 16 is integrated with the side plates 18a to 18d by insert molding or the like. Incidentally, the frame 16 is formed in a frame shape in the embodiments. However, a configuration is adopted in which only the third portion 16c and the fourth portion 16d are formed and the first portion 16a and the second portion 16b are not formed. In this case, only the third portion 16c and the fourth portion 16d function as a reinforcing member. In addition, a configuration in which only the fourth portion 16d is provided in the casing 18 as a reinforcing member can be adopted.

FIG. 4 is a plan view showing a part of the backlight unit BL shown in FIG. 3. In FIG. 4, in addition to FIG. 3, the second wiring board 32, and the first slit SL1 and the second slit SL2 of the bottom plate 17 are illustrated, and the frame 16 is represented by hatching.

A recess portion 101 is overlaid on the first slit SL1. A recess portion 102 is overlaid on the second slit SL2. The connection end portion 32c of the second wiring board 32 is folded back to the back surface side of the casing 18 as shown in FIG. 2 through the space between the recess portion 102 and the side plate 18d and through the second slit SL2. The inner edges of the first slit SL1 and the second slit SL2 are located more closely to the light guide LG than the inner surface of the fourth portion 16d accommodated in the casing 18.

FIG. 5 is a plan view showing the display panel PNL arranged on the backlight unit BL shown in FIG. 4.

The first substrate SUB1 is overlaid on the side plates 18a and 18b, the first portion 16a, and the second portion 16b. In addition, the first substrate SUB1 is overlaid on a part of the fourth portion 16d. On the side plate 18d side, the side edge of the backlight unit BL is located slightly on an outer side than the side edge of the first substrate SUB1.

The first wiring board 23 is folded back to the back surface side of the casing 18 as shown in FIG. 2 between the recess portion 101 and the side plate 18d and through the first slit SL1. The connection end portion 32c of the second wiring board 32 extends to the outside of the first board SUB1.

Figure 6:
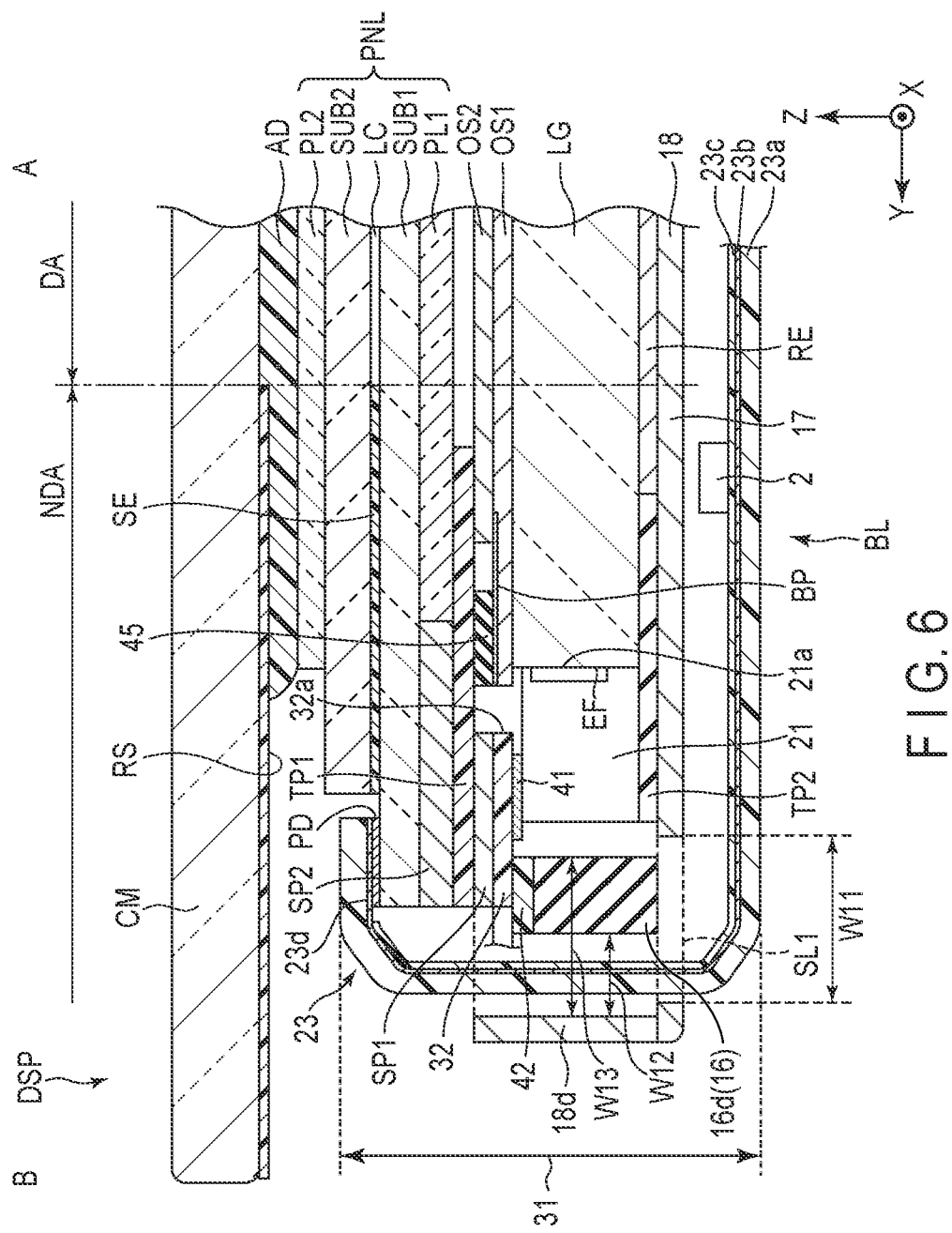
FIG. 6 is a sectional view of the display device taken along line AB shown in FIG. 5.

FIG. 6 is a cross-sectional view of the display device DSP taken along line AB shown in FIG. 5.

The display panel PNL comprises a first substrate SUB1, a second substrate SUB2, and a liquid crystal layer LC sealed with a sealing member SE. A polarizer PL1 is stuck on a lower surface of the first substrate SUB1. A polarizer PL2 is stuck on the upper surface of the second substrate SUB2.

A lower surface of the cover member CM is stuck on the polarizer PL2 of the display panel PNL with an adhesive AD or a tackiness agent having optical transparency.

The backlight unit BL further comprises a reflection sheet RE arranged on the bottom plate 17, and a plurality of first optical sheets OS1 and second optical sheets OS2 arranged to be overlaid on the light guide LG. The members constituting the backlight unit BL such as the reflection sheet RE, the light guide LG, the first optical sheet OS1 and the second optical sheet OS2, the light source 21, the second wiring board 32, and the frame 16 are accommodated in the casing 18.

The light source 21 is fixed to the light guide LG by, for example, a fixing tape TP2 provided to extend from the lower surface of the light source 21 to the lower surface of the light guide LG. Incidentally, the fixing tape TP2 is not bonded to the bottom plate 17. The light source 21 is arranged between an incident surface EF of the light guide LG and the side plate 18d, and the light emitting surface 21a of the light source 21 faces the incident surface EF or abuts on the incident surface EF. The light emitted from the light source 21 is made incident on the light guide LG from the incident surface EF, propagates in the light guide LG, or is reflected on the reflection sheet RE, and is emitted from the upper surface of the light guide LG to the display panel PNL side.

The second wiring board 32 is stuck on the fourth portion 16d of the frame 16 with a double-sided tape 42. The second wiring board 32 is located on substantially the same plane as the first optical sheet OS1 and is opposed to the bottom plate 17 with the light source 21 interposed therebetween. A side edge 32a of the second wiring board 32 is opposed to the end of the first optical sheet OS1 with a gap interposed therebetween. A plurality of connection pads 41 formed of a conductive layer are provided on one surface of the second wiring substrate 32. The light sources 21 are mounted on the connection pads 41.

The backlight unit BL is attached to the display panel PNL with a double-sided tape TP1. An inner peripheral part of the double-sided tape TP1 is stuck on the polarizer PL1, and an outer peripheral part is stuck on the first substrate SUB1 with the spacer SP2 interposed therebetween. In addition, the double-sided tape TP1 is stuck on the second wiring board 32 via the spacer SP1 and is further stuck on a light-shielding tape 45.

The first wiring board 23 includes a layered or sheet-shaped base 23a, a conductive layer 23b formed on one surface of the base 23a and constituting a plurality of lines, connection pads, and the like, and a protective layer 23c covering the conductive layer 23b. The base 23a and the protective layer 23c are formed of, for example, a synthetic resin such as polyimide or polyurethane, and the conductive layer 23b is formed of a conductive metal layer, for example, a copper foil.

The first wiring board 23 passes between the side plate 18d and the light guide LG and through the first slit SL1 and is bent toward the back surface side of the casing 18. That is, the first wiring substrate 23 constitutes a curved portion 31 which is curved from the display panel PNL to the bottom plate 17 side of the casing 18. The first wiring board 23 is arranged in a direction in which the protective layer 23c side is opposed to the display panel PNL. The protective layer 23c and the conductive layer 23b are located on the inner peripheral side of the curved portion 31, and the base 23a is located on the outer peripheral side of the curved portion 31.

A plurality of connection terminals 23d formed by parts of the conductive layer 23b are provided at one end of the first wiring board 23. The plurality of connection terminals 23d are electrically connected to the plurality of pads PD of the first substrate SUB1, respectively, by thermally compressing one end of the first wiring substrate 23 on the first substrate SUB1. The driver IC chip 2 is mounted on the protective layer 23c side, and is electrically connected to the conductive layer 23b of the first wiring board 23 via an opening or connection pad (not shown) provided in the protective layer 23c.

A width W11 of the first slit SL1 is desirably large enough to allow the first wiring board 23 to pass therethrough, for example, in a state in which the driver IC chip 2 and the connector are mounted on the first wiring board 23. In the embodiments, for example, the width W11 of the first slit SL1 is approximately 2 mm or more. In addition, the thickness of the first wiring board 23 is, for example, approximately 0.1 mm. Therefore, when the frame is attached after the first wiring board 23 passes through the slit SL1, a width W12 between the side plate 18d and the frame 16 may be approximately 0.3 mm or more. Furthermore, since the first wiring board 23 is bent so as to surround the upper and lower parts of the frame 16, a width W13 from the side plate 18d to the inner circumference of the frame 16 is, for example, approximately 0.5 mm or more. In contrast, the width W12 between the side plate 18d and the frame 16 needs to be approximately 2 mm or more in order to first mount the frame 16 in the casing 18 and then pass the first wiring board 23 through the first slit SL1. In this case, the width of the first slit SL1 is also increased as necessary.

According to the embodiments, the casing 18 includes the first slit SL1 in the bottom plate 17, and the first wiring board 23 is bent from the inside of the side plate 18d through the first slit SL1. For this reason, even if a force that expands toward the outside of the side plate 18d is generated in the curved portion 31 due to the repulsive force of bending, the swelling of the curved portion 31 can be suppressed by the side plate 18d. Therefore, an increase in the frame width of the display device DSP caused by the swelling of the curved portion 31 can be suppressed. The frame width can be reduced by, for example, approximately 0.5 mm as compared to a configuration in which the curved portion 31 is located outside the side plate 18d. Therefore, the frame on the mounting portion side of the display device DSP can be narrowed.

Figure 7:
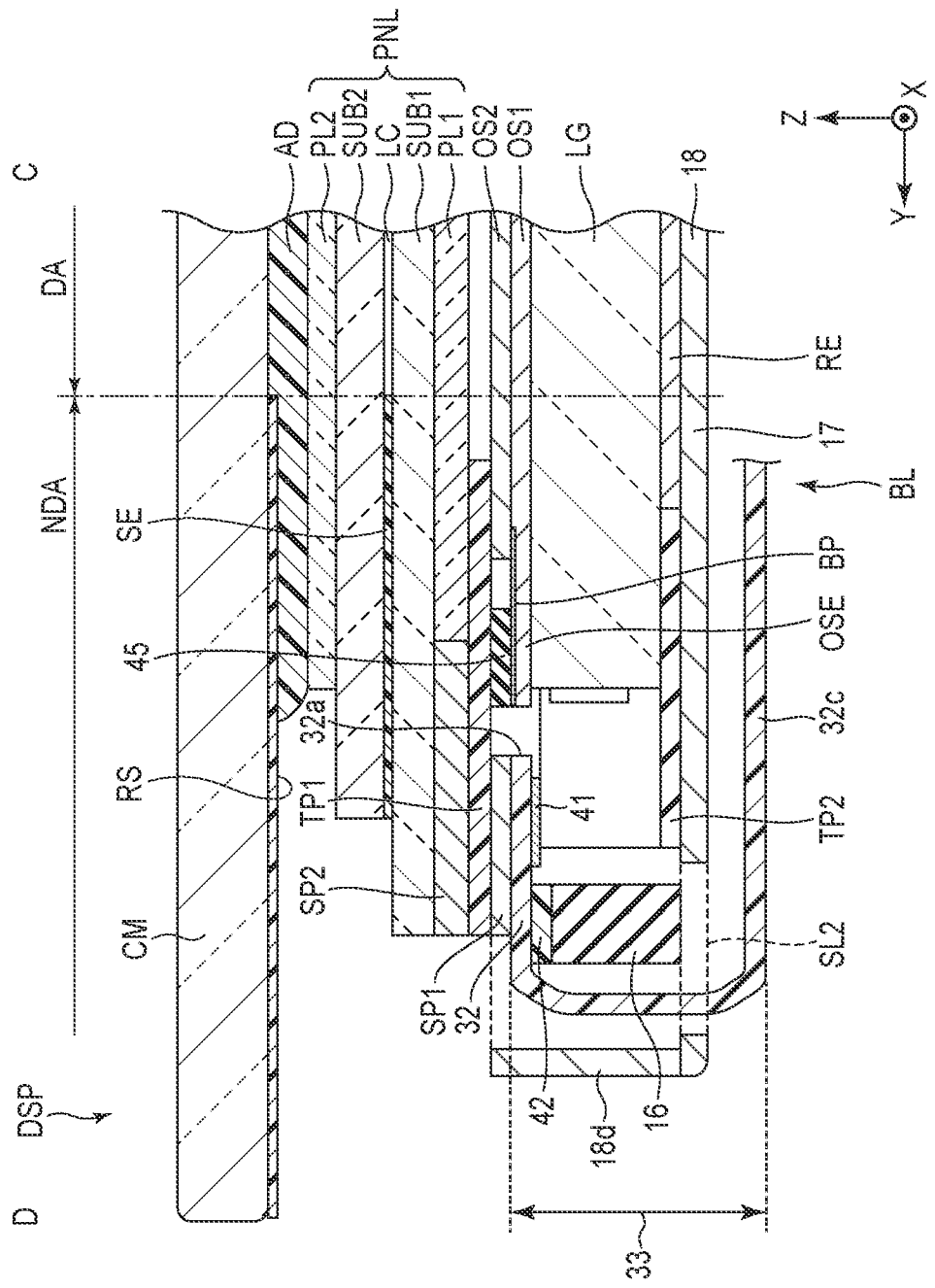
FIG. 7 is a cross-sectional view of the display device taken along line CD shown in FIG. 5.

FIG. 7 is a sectional view of the display device DSP taken along line CD shown in FIG. 5.

The connection end portion 32c passes between the side plate 18d and the light guide LG and through the second slit SL2 and is bent toward the back surface side of the casing 18. That is, the second wiring substrate 32 forms a curved portion 33 that is curved from the display panel PNL to the bottom plate 17 side of the casing 18. Similarly to the case shown in FIG. 6, even if a force that expands toward the outside of the side plate 18d due to the repulsive force of bending is generated at the curved portion 33, the swelling of the curved portion 33 can be suppressed by the side plate 18d. The frame of the display device DSP can be therefore narrowed.

Figure 8:
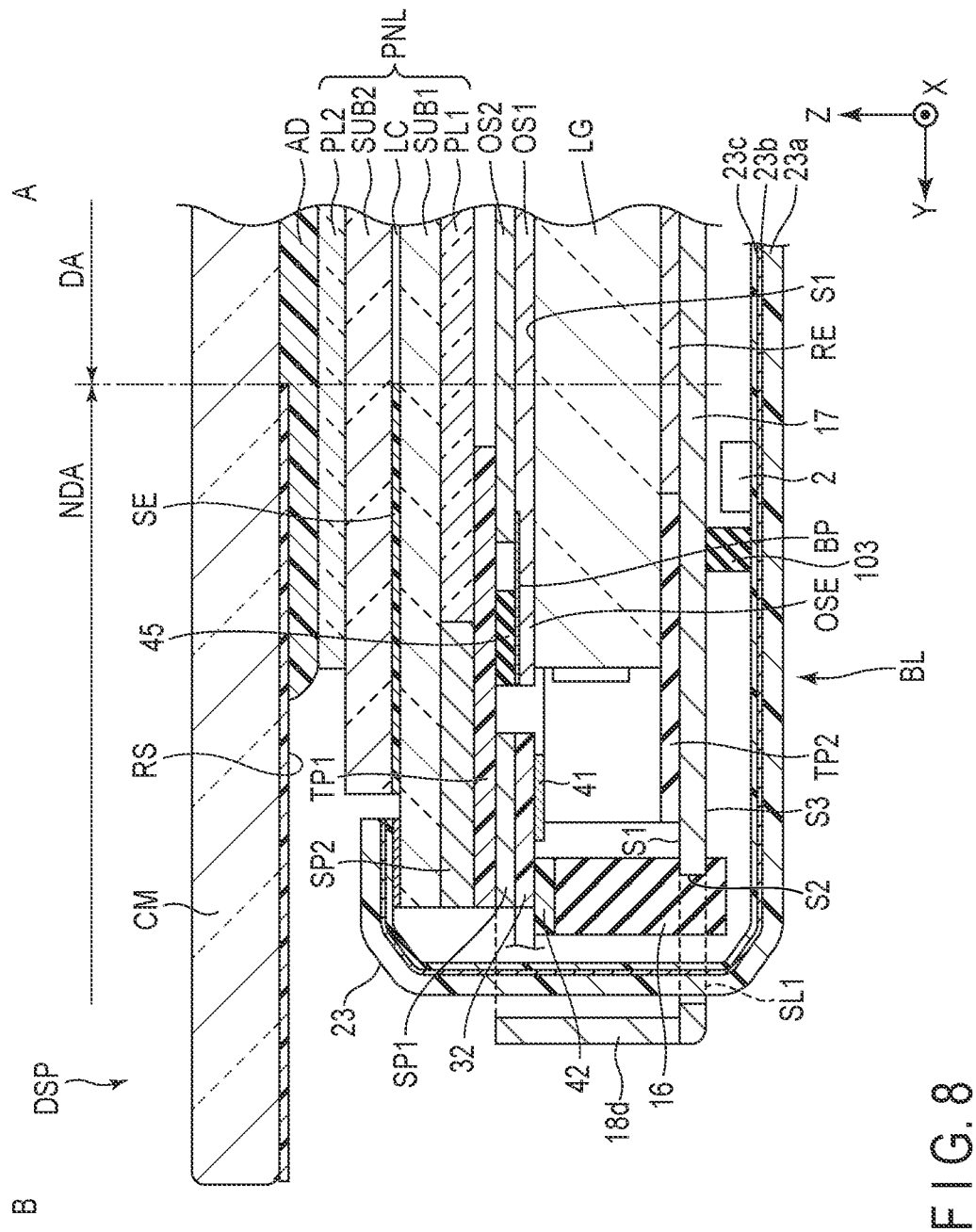
FIG. 8 is a cross-sectional view showing a modified example of the display device shown in FIG. 6.

FIG. 8 is a cross-sectional view showing a modified example of the display device DSP shown in FIG. 6. The configuration shown in FIG. 8 is different from the configuration shown in FIG. 6 with respect to a feature that frame 16 enters the first slit SL1.

The bottom plate 17 includes an upper surface S1 on the light guide LG side, a side surface S2 in the first slit SL1, and a lower surface S3 on a side opposite to the upper surface S1. The frame 16 is in contact with the upper surface S1, the side surface S2, and the lower surface S3. That is, the frame 16 is located between the side surface S2 and the first wiring board 23, and the side surface S2 is covered with the frame 16. For this reason, abutment of the first wiring board 23 on the bottom plate 17 inside the first slit SL1 can be suppressed. Therefore, even when the conductive layer 23b of the first wiring board 23 is exposed, conduction between the conductive layer 23b and the casing 18 can be suppressed. Incidentally, in order to suppress the first wiring board 23 abutting on the side surface S2, a member 103 such as a sponge may be arranged between the first wiring board 23 and the bottom plate 17 as shown in the figure.

Figure 9:
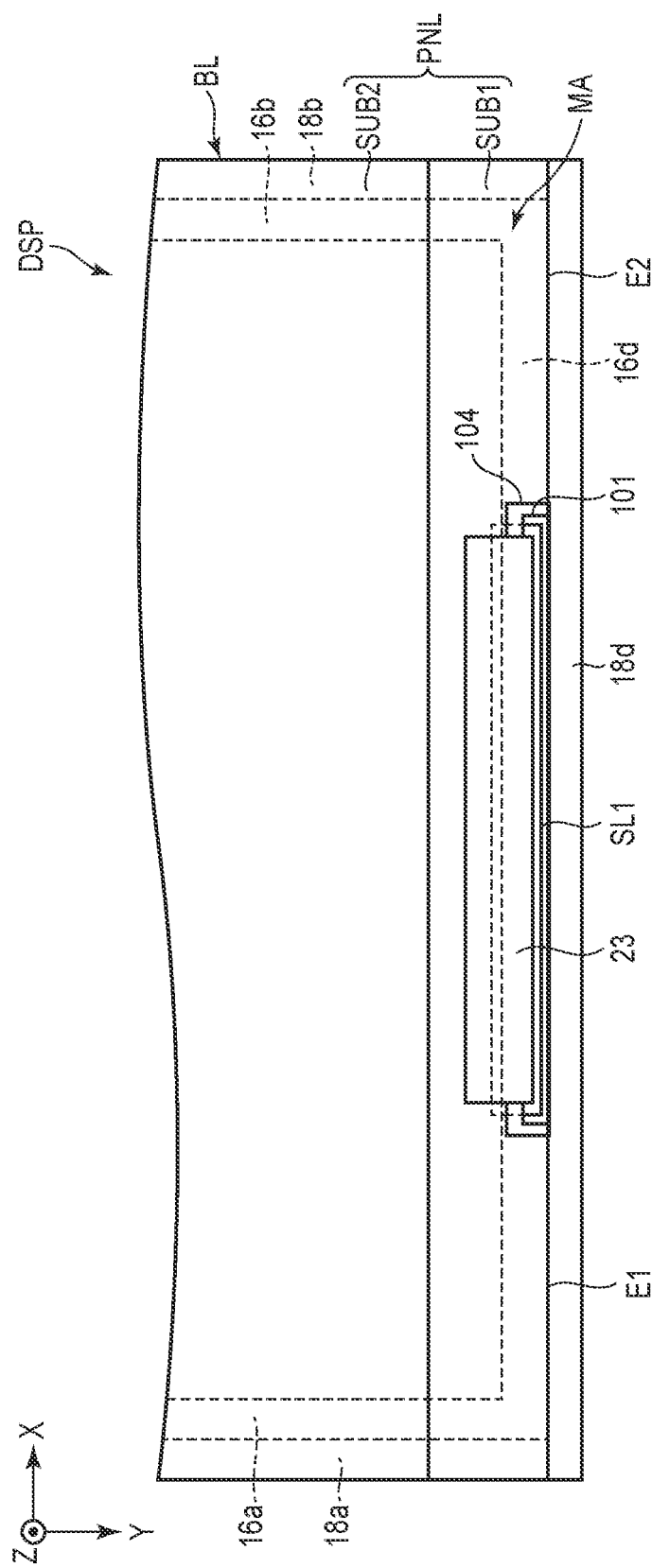
FIG. 9 is a plan view showing a modified example of the display device shown in FIG. 5.

FIG. 9 is a plan view showing a modified example of the display device DSP shown in FIG. 5. The configuration shown in FIG. 9 is different from the configuration shown in FIG. 5 with respect to a feature that the first substrate SUB1 includes a recess portion 104 at a position overlaid on the first slit SL1. The recess portion 104 is formed by shaving a central part of the mounting portion MA of the first substrate SUB1 by a predetermined width from an edge. The first wiring board 23 passes through the recess portion 104. The first substrate SUB1 includes extending portions E1 and E2 that extend to the side plate 18d at both ends of the recess portion 104. The extending portions E1 and E2 are overlaid on the fourth portion 16d of the frame 16. Incidentally, the extending portions E1 and E2 may also be overlaid on the side plate 18d. By forming such extending portions E1 and E2, the area of the mounting portion MA can be enlarged and a margin can be given to a space for arranging the lines and the like.

As described above, according to the embodiments, a display device capable of narrowing the frame can be obtained.

Incidentally, in the embodiments, the configuration in which the frame 16 includes the recess portion 101 and the recess portion 102 has been described. However, the configuration is not limited to this example. For example, the frame 16 may not include the recess portion 101 or the recess portion 102. In this case, after the first wiring substrate 23 and the second wiring substrate 32 are passed through the first slit SL1 and the second slit SL2, the frame 16 may be arranged at a position overlaid on the slit SL1 and the second slit SL2. In addition, for example, the frame 16 may not be interrupted and arranged at a position overlaid on the first slit SL1 and the second slit SL2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a display panel;
a first wiring board mounted on the display panel; and
a backlight unit located on a back surface side of the display panel to illuminate the display panel, wherein
the backlight unit comprises a casing which includes a bottom plate including a first slit and a second slit, and a side plate standing at the bottom plate, a light guide arranged in the casing, a plurality of light sources arranged along the side plate, a second wiring board on which the plurality of light sources are mounted, and a reinforcing member arranged inside the side plate,
the first wiring board passes between the side plate and the light guide and through the first slit and is bent toward a back surface side of the casing, and
the second wiring board includes a connection end portion passed between the side plate and the light guide and through the second slit and bent toward the back surface side of the casing, and passes between the reinforcing member and the side plate.

2. The display device of claim 1, wherein
the first wiring board passes between the reinforcing member and the side plate.

3. The display device of claim 2, wherein
the reinforcing member includes a first recess portion at a position overlaid on the first slit, and
the first wiring board passes between the first recess portion and the side plate.

4. The display device of claim 1, wherein
the reinforcing member includes a second recess portion at a position overlaid on the second slit, and
the second wiring board passes between the second recess portion and the side plate.

5. The display device of claim 1, wherein
the display panel includes a third recess portion at a position overlaid on the first slit, and
the first wiring board passes through the third recess portion.

6. The display device of claim 1, wherein
the bottom plate includes a side surface in the first slit, and
the reinforcing member extends between the side surface and the first wiring board and covers the side surface.

* * * * *